United States Patent [19]
Adams et al.

[11] Patent Number: 6,045,670
[45] Date of Patent: Apr. 4, 2000

[54] BACK SPUTTERING SHIELD

[75] Inventors: Bret Adams, Sunnyvale; Gregory N. Hamilton, Santa Clara, both of Calif.

[73] Assignee: Applied Materials, Inc., Santa Clara, Calif.

[21] Appl. No.: 08/780,752

[22] Filed: Jan. 8, 1997

[51] Int. Cl.[7] .................................................. C23C 14/34
[52] U.S. Cl. ............................. 204/298.11; 204/298.12; 204/192.12
[58] Field of Search ......................... 204/298.11, 298.12, 204/192.12

[56] References Cited

U.S. PATENT DOCUMENTS

| | | | |
|---|---|---|---|
| 4,472,259 | 9/1984 | Class et al. . | |
| 4,525,262 | 6/1985 | Class et al. . | |
| 4,933,063 | 6/1990 | Katsura et al. | 204/298.12 |
| 4,966,676 | 10/1990 | Fukasawa et al. . | |
| 5,271,817 | 12/1993 | Brugge et al. . | |
| 5,328,582 | 7/1994 | Cole | 204/298.11 |
| 5,334,298 | 8/1994 | Gegenwart . | |
| 5,391,275 | 2/1995 | Mintz | 204/192.32 |
| 5,538,603 | 7/1996 | Guo | 204/298.11 |
| 5,540,821 | 7/1996 | Tepman | 204/298.11 |
| 5,632,873 | 5/1997 | Stevens et al. | 204/298.11 |
| 5,635,036 | 6/1997 | Demaray et al. | 204/298.11 |

FOREIGN PATENT DOCUMENTS

| | | |
|---|---|---|
| 0 127 272 A2 | 12/1984 | European Pat. Off. . |
| 0 210 473 A2 | 2/1987 | European Pat. Off. . |
| 0 439 360 A2 | 1/1991 | European Pat. Off. . |
| 63-192863 | 8/1988 | Japan . |
| 1-208459 | 8/1989 | Japan . |
| 2-19461 | 1/1990 | Japan . |
| 4-285161 | 10/1992 | Japan . |
| 5-93268 | 4/1993 | Japan . |

OTHER PUBLICATIONS

Austrian Patent Search Report Dated Oct. 23, 1998.

*Primary Examiner*—Rodney G. McDonald
*Attorney, Agent, or Firm*—Thomason Moser & Patterson

[57] ABSTRACT

An improved target assembly for a deposition chamber wherein the backing plate which mounts a metal target has a groove for receiving a target shield. The target shield can be replaced during normal cleaning operations without replacement of the remainder of the target assembly. The target shield can be used with targets having tapered edges.

28 Claims, 2 Drawing Sheets

BACK SPUTTERING SHIELD

BACKGROUND OF THE INVENTION

1. Field of the Invention

The present invention relates to semi-conductor processing equipment, more specifically to an improved target assembly for ameliorating the effect of back sputtering during vapor deposition.

2. Background of Related Art

In semiconductor processing, and more specifically in physical vapor deposition, a target is disposed on a backing plate in the upper portion of a chamber and a plasma is struck between a work piece and the target to produce ions which bombard the target and result in the deposition of target material onto the work piece. While most processes are finely tuned to result in deposition of target material onto the work piece in a trajectory which is normal to the work piece, some particles are redeposited on or near the target itself. These particles become a source of contamination which loosely adhere to the target and surrounding areas of the chamber and may eventually flake off and fall onto the work piece.

Efforts aimed at reducing the concentration of particles in sputter chambers have taken many different approaches. One approach is to periodically clean the chamber using a wet-clean process. Another approach is to clean the chamber with a cleaning gas that reacts with the deposits. The gaseous by-products of these reactions are exhausted from the chamber. However, in both of these approaches, the deposition process must be discontinued during the cleaning process and additional time must be taken for the cleaning materials and by-products to be evacuated from the chamber before the deposition process can resume.

Another method for managing the particle concentration in a chamber involves the use of sputter shields that prevent sputtered particles from depositing directly on the chamber walls. The sputter shield is periodically replaced as part of the process kit so that buildup of potentially harmful deposits never gets out of control. This method can reduce the frequency at which the chamber must be cleaned, but a fraction of the particles still pass around the shield and eventually form deposits that must be cleaned.

Another approach is to replace what is known as the processing kit components. Typically, a processing kit includes both a cylindrical sputter shield and a clamp ring which holds the work piece on the support member. The cylindrical shield is suspended in the chamber below the target and prevents deposition on the chamber walls, while the clamp ring is disposed in the chamber near the work piece to expose one surface of the work piece to the target. The cylindrical shield and clamp ring are consumables that are periodically removed from the chamber and replaced with new components. However, the target is an expensive item and is not replaced as often as the shield and clamp ring. Therefore, the target still accumulates particles that can result in product failure and frequently must be replaced prior to the planned life of the target.

The problem of redeposition of sputtered material back onto the target sidewall has also been recognized as an undesirable source of particles in the chamber. Sputtered particles that become scattered in the chamber atmosphere can redeposit onto the side of the target and accumulate to form particles of the deposition material. Because RF or DC power is applied to the target during sputter deposition on a substrate and then removed from the target between substrates, the target, as well as the redeposited material, is continually heated and cooled and thereby subjected to thermal stress. Over a period of time, this stress will cause particles of the redeposited material to come loose and fall onto the substrate.

U.S. Pat. No. 5,334,298 describes a sputtering cathode which was designed to reduce sputtering around the edges of a target. A "dark space shield" was added to expose only one surface of the target and stop ignition of plasma around the perimeter of the target. Such a shield could be replaced along with other components as needed to reduce particle contaminants.

The target in a physical vapor deposition system is typically attached to a baseplate which serves as a lid to the deposition chamber. The portion of the baseplate surrounding the outer perimeter of the target is an area in which back sputtered particles tend to deposit, and then, over time, fall to deposit on the substrate.

Therefore, there exists a need to provide a method and apparatus which provides an easy and cost effective way of removing particles from the sputter chamber. More particularly, there is a need for a method and apparatus for periodically cleaning the surfaces around a target in a process chamber on which back sputtered particles may deposit. It would be most desirable if the apparatus and method could be carried out in accordance with usual and customary cleaning processes in order to maintain the substrate throughput of the system.

SUMMARY OF THE INVENTION

The invention is an improved target assembly for a deposition chamber wherein the backing plate which mounts a target has a groove for receiving a target shield. The target shield collects stray particles and can be replaced during normal cleaning operations without replacement of the remainder of the target assembly. The target shield can be used with targets having tapered edges.

BRIEF DESCRIPTION OF THE DRAWINGS

So that the manner in which the above recited features, advantages and objects of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DETAILED DESCRIPTION OF THE INVENTION

The process of sputtering is a physical vapor deposition (PVD) technique in which a solid material, such as titanium or aluminum, is used as the source (also referred to as the "target") and is bombarded with ions which cause ejection of target material and deposition of the ejected material onto a work piece. The target is typically mounted to a backing plate and positioned in the top of a vacuum chamber containing an inert gas such as argon. A DC or RF voltage may then be applied to the target to generate a plasma in the region between the target and the work piece. The high energy ions in the plasma, such as argon ions, bombard the target and dislodge metal atoms. The metal atoms or particles may have various trajectories that cause deposition on a desired surface, such as a substrate, as well as on the chamber walls and other chamber components. Furthermore, particle trajectories may be changed by interaction with the plasma or collisions with gas molecules or the like.

Figure 1:
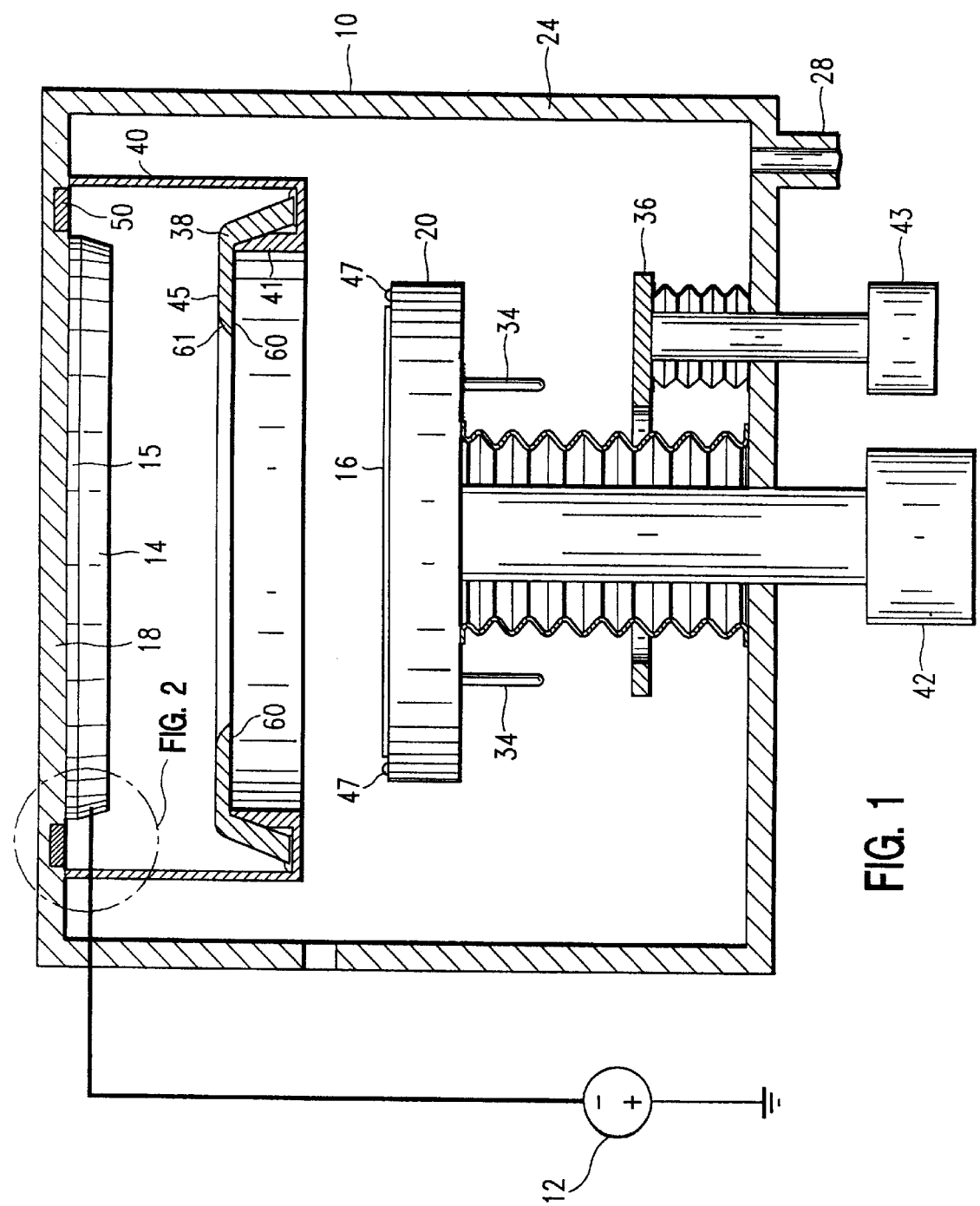
FIG. 1 is a cross-sectional view through, a typical physical vapor deposition chamber showing a target assembly that is an embodiment of the present invention.

A simplified sectional view of a conventional sputtering chamber 10 which has been modified in accordance with the present invention is shown in FIG. 1 and includes a conventional sputtering target 14 which typically has edges tapered at about 15° from normal. The chamber 10 generally includes a chamber enclosure wall 24, having at least one gas inlet (not shown) and an exhaust outlet 28 connected to an exhaust pump (not shown). A substrate support pedestal 20 is disposed at the lower end of the chamber 10, and a target 14 is received at the upper end of the chamber 10 opposite the substrate support pedestal 20. The target 14 is connected to an insulative member 15 which electrically isolates the target 14 from the enclosure wall 24. The insulative member 15 is typically a non-conductive metal such as aluminum oxide and is generally disposed between the target 14 and a backing plate 18 which forms a portion of the enclosure wall 24.

The backing plate 18 typically forms a wall of the chamber, preferably a removable lid which provides access to the chamber 10. The combination of the backing plate 18, the insulative member 15, and the target 14 forms a target assembly which is conveniently replaced as a unit when the target 14 stops producing a consistent and reproducible distribution of metal atoms. The enclosure wall 24, including the backing plate 18, is preferably grounded, so that a negative voltage may be maintained on the target 14 with respect to the grounded enclosure wall 24. A support shield 40 may be suspended from the backing plate 18 or other portion of the enclosure wall 24, where the shield 40 preferably includes an annular, upturned, wall 41 on which a clamp ring 38 may be suspended over the pedestal 20 when the pedestal 20 is retracted downwardly in the chamber 10 as shown in FIG. 1. When a gas is introduced into the chamber at low pressure, a negative bias voltage is applied to the target and the chamber walls are grounded, a portion of the gas can be ionized to form a plasma. The positively charged gas ions are electrically attracted to the sputter target and collide therewith to dislodge atoms or larger particles of target material from the target.

In sputtering, the chamber 10 is used to form a metal film by sputtering particles from the target 14 onto a substrate 16. A major portion of the sputtered metal atoms or groups of atoms follow a substantially linear trajectory over a distribution of angles due to the low pressure maintained in the chamber. The gas composition and pressure in the sputtering chamber 10 is typically achieved by evacuating the chamber to between about $10^{-6}$ to about $10^{-9}$ Torr before back-filling the chamber 10 with argon to a pressure of a few mTorr. At these gas pressures, the distance between the target 14 and the substrate 16 can be less than the mean free path of the argon gas molecules. Therefore, many sputtered particles travel directly to the substrate 16 without a collision with other particles. However, a significant portion of the sputtered particles become scattered in the gas, due to collisions within the plasma discharge, electrical field effects and the like. These scattered particles can redeposit onto various surfaces of the chamber 10, including the exposed areas of the backing plate 18, the insulative member 15, and the target 14 itself.

Accumulation of redeposited particles around the target edge can eventually form an electrical short between the target 14 and the backing, plate 18 requiring that the chamber be shut down and cleaned. Redeposition of particles can also lead to a buildup of material on the target and backing plate that will periodically flake off, thereby generating undesired particles that can then cause fatal defects in devices formed from the substrate 16, typically integrated circuit devices.

Figure 2:
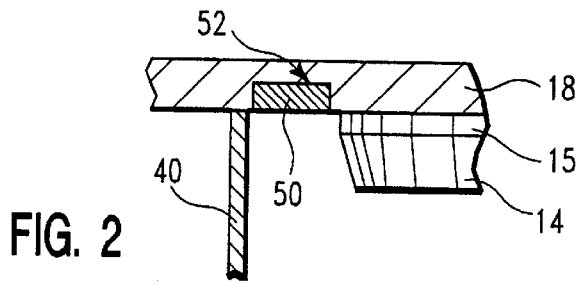
FIG. 2 is an expanded view of a portion of the target assembly identified in FIG. 1.
Figure 3:
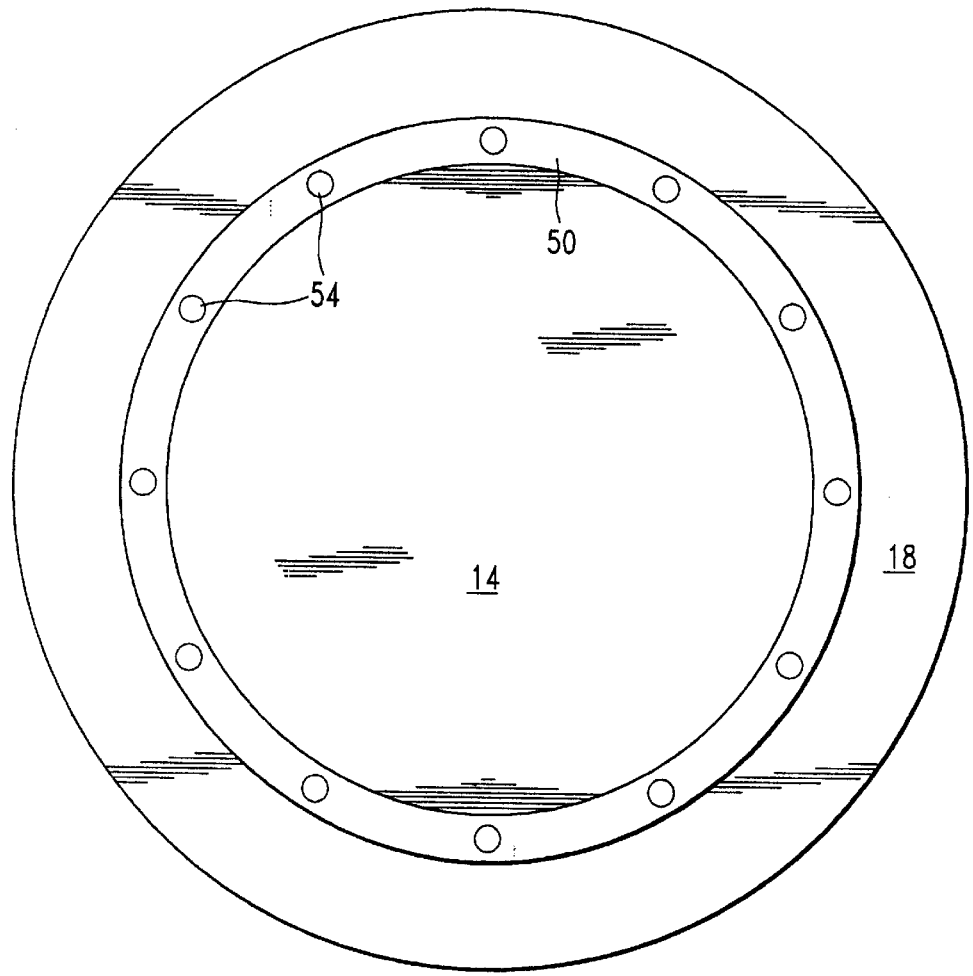
FIG. 3 is a bottom view showing a target shield connected to a backing plate.

Referring to FIGS. 1–3, the present invention provides a modified target assembly for use in a conventional deposition chamber 10. The target assembly has a backing plate 18, typically made of anodized aluminum, modified to include a removable target shield 50 positioned on the face of the backing plate adjacent the target. The target shield 50 is preferably a metal ring which is mounted in an annular groove 52 in the backing plate 18. The target shield 50 is disposed about the outer perimeter of the target where significant particle deposition occurs in conventional deposition chambers. While a target shield providing some benefit can be made with a variety of inner and outer dimensions with respect to the target is preferred that the target shield have an inner dimension that abuts the edge of the target and an outer dimension that extends away from the target to at least a point where the tipper edge of the sputter shield protects the outer perimeter of the backing plate 18. A target shield having these dimensions cooperates with the sputter shield and clamp ring to provide a system of continuous deposition shields between the target and the substrate which are quickly and easily replaced.

Figure 4:
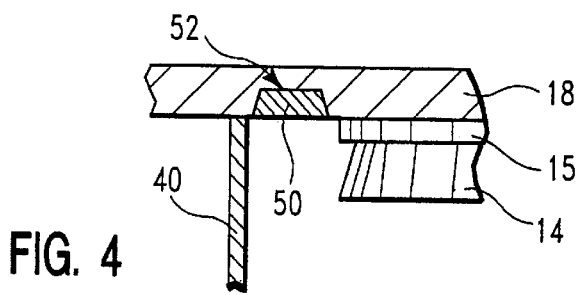
FIG. 4 is an alternative expanded view of FIG. 2 showing an alternative embodiment wherein the target edges are tapered to reduce accumulation of particles on the edges.

The target shield 50 is preferably recessed into the backing plate 18 to provide a planar surface therewith and avoid interference with the target 14. The target shield 50 may be fastened to the backing plate 18 by any conventional fastening means, preferably flat head screws 54 that are flush with the surface of the target shield 50 and made of the same material as the shield. The target shield 50 preferably has a rectangular cross-section with a rough exposed surface to increase adhesion to stray particles. It may be further desirable for the annular groove 52 and mating target shield 50 to have outwardly tapered side walls (i.e., the groove width increases as it approaches the surface of the backing plate exposed to the chamber environment as shown in FIG. 4) to assist in the placement and removal of the shield and to accommodate any expansion of the various components during processing.

It is preferred that the target shield 50 be produced from a material having the same or similar expansion coefficient as the target. Preferably, the shield 50 is made of the same material as the target, such as Ti, Cu, or Al, or stainless steel. Stainless steel has advantages from a cost efficient standpoint. In addition, the shield 50 may be made of the same metal as the backing plate, such as anodized aluminum, although a different material could be selected based on improved performance in repulsing or adhering to stray particles. Preferred materials for the target shield include Ti, Cu, Al and stainless steel, with the most preferred material being the target material in a selected process. The choice of materials depends not only on improving, the operation of the process chamber, but also the ability to remove the target shield 50 from the backing plate 18 during normal cleaning operations.

The roughness of the target shield is important for providing sufficient mechanical support for particles depositing thereon. When the material is too smooth, the redeposited particles only loosely adhere to the smooth surface and can very easily detach and fall onto a substrate during processing. While it would be desirable to avoid redeposition, once target material is in fact redeposited, it is generally preferred that the material firmly attach rather than flake off or otherwise separate from the shield surface. Therefore, the preferred roughness for the target shield of the present invention is between about 0.05 mm and about 0.5 mm.

In preparation for receiving a semiconductor substrate 16 into the chamber 10 for processing, the substrate support pedestal 20 is lowered by a drive mechanism well below the clamp ring 38 suspended on the shield 40, and so that the bottom of the pedestal 20 is close to a pin positioning platform 36. The pedestal 20 typically includes three or more vertical bores (not shown), each of which contains a vertically slidable pin 34. When the pedestal 20 is in the lowered position just described, the bottom tip of each pin 34 rests on the platform 36, and the upper tip of each pin protrudes above the upper surface of the pedestal 20. The upper tips define a plane parallel to the upper surface of the pedestal 20.

A conventional robot arm (not shown) typically transfers the substrate 16 into the chamber 10 and places the substrate 16 above the upper tips of the pins 34. A lift mechanism 43 moves the pin platform 36 upwardly, to place the upper tips of the pins 34 against the underside of the substrate 16 to lift the substrate 16 off the robot arm. The robot arm then retracts from the chamber 10, and the lift mechanism 43 raises the pedestal 20 so that the pins slide down in the pedestal 20, thereby lowering the substrate 16 onto the top surface of the pedestal 20. Substrate alignment pins 47 disposed on the perimeter of the upper surface of the pedestal 20 provide a sloped surface to urge the substrate 16 into a centered position.

The lift mechanism 43 continues to raise the pedestal 20 until the substrate 16 is an appropriate distance from the target 14. When an annular clamp ring 38 is used, the substrate 16 contacts the inner portion 60 of the annular clamp ring 38 resting on the upturned wall portion 41 and lifts the clamp ring off the upturned wall portion. The inner diameter of the clamp ring 38 is slightly smaller than the diameter of the substrate 16 so that the edge of the substrate is protected from the deposition environment and supports the weight of the clamp ring.

At this point, the film deposition process can begin. In the case of the exemplary sputtering chamber 10 shown in FIG. 1, a sputtering process gas (typically argon) is supplied to the chamber through the gas inlet (not shown), and a DC power supply 12 applies a negative voltage to the sputtering target 14. The voltage excites the argon gas to a plasma state, and argon ions bombard the negatively biased target 14 to sputter material off the target 14. Sputtered material then deposits on the substrate 16, except for the periphery thereof which is shielded by the clamp ring 38.

After a film layer has been deposited on the substrate 16, the substrate 16 is removed from the chamber 10 by reversing the sequence of steps by which it was carried into the chamber 10. Specifically, the lift mechanism 43 lowers the pedestal 20 below the upturned wall portion 41, so that the clamp ring 38 descends onto the shield. At this point the weight of the clamp ring 38 is supported by the shield 40, not by the substrate 16 and pedestal 20. The clamp ring 38 may comprise a leaf spring 45 to assist in separating the substrate 16 from the clamp ring 38. During deposition, deposits may form at the interface of the clamp ring 38 and substrate 16. The biasing force of the leaf spring 45 separates the clamp ring 38 from the substrate without causing damage to the substrate.

Performance of the target shield 50 of the present invention as described above may be enhanced by altering the profile of the target edges. For example, the target edges may be tapered to reduce accumulation of particles as shown in FIG. 4. However, it should be recognized that the target edge may have any profile within the scope of the present invention.

The frequency at which process components are replaced is effected by the particular process conditions and chamber design. For example, in one aspect of the invention, a process kit may include a sputter shield, clamp ring, collimator and a target shield of the present invention. It is possible that any of these kit components will be the first to require replacing. If the gas pressure is high, there may be greater particle scattering in the gas causing greater redeposition on the target shield. If the collimator is designed to pass only those particles with trajectories within a few degrees of normal to the substrate surface, then the collimator will receive greater amounts of deposits. It should be understood by one in the art that certain chambers and processes may result in one component of the kit receiving deposition at a greater rate than the other components and, therefore, may require more frequent replacement. However, it is generally preferred that the entire processing kit be replaced at the same time to minimize process interruptions.

The target shield 50 provides improved particle performance and target life in two ways: Firstly, removing and replacing the target shield 50 allows the continued use of the target until it is fully consumed, while ridding the chamber of particles that have accumulated on the target shield and have potential for interfering with the deposition process or reducing product quality; and, secondly, removing and replacing the target shield removes a possible short circuit pathway where metal particles have accumulated.

The target shield is preferably replaced during replacement of the processing kit and following the same general procedures. When the chamber has been shut down, i.e. the power is off and the chamber has been purged and pressurized to near atmospheric pressure, the chamber is opened and the target and target shield are inspected. If the target has been fully consumed, then the target and backing plate are replaced. If the target has remaining life, the target shield having deposits thereon is detached and a clean target shield is mounted in its place. After replacement of the other processing kit components, the chamber is closed for further processing. In this manner, significant amounts of potentially-contaminating particle deposits are quickly removed from the chamber without using reactive gases or liquids, and the useful life of the target is limited by the quantity of target material thereon, and not by contamination of the backing plate with backsputtered materials.

While the foregoing is directed to preferred embodiments of the present invention, other and further embodiments of the invention may be devised without departing from the basic scope thereof, and the scope thereof is determined by the claims which follow.

We claim:

1. A target assembly for a deposition chamber, comprising:
   a backing plate for mounting a target in the chamber, the backing plate having an exposable surface surrounding the target; and
   a target shield removably disposed in the chamber on the exposable surface of the backing plate wherein the target shield is substantially disposed on the backing plate and wherein an inner diameter of the target shield is equal to or greater than an outer diameter of the target.

2. The target assembly of claim 1, wherein the target shield is fastened to the backing plate.

3. The target assembly of claim 1, wherein the exposable surface defines a groove.

4. The target assembly of claim 3, wherein the target shield has a rectangular cross section.

5. The target assembly of claim 3, wherein the target shield has inner and outer sidewalls that are tapered.

6. The target assembly of claim 1, wherein the target shield comprises a surface roughness for improved adhesion of any particles contacting the target shield.

7. The target assembly of claim 4, wherein the target shield has a plurality of fastener-receiving holes disposed therethrough.

8. The target assembly of claim 7, wherein the target shield is fastened to the backing plate by fasteners extending through the fastener-receiving holes and having a first end that is flush with an outer surface of the target shield.

9. The target assembly of claim 1, wherein the target comprises tapered edges.

10. The target assembly of claim 1, wherein an insulative member is disposed between the backing plate and the target.

11. A target assembly for a deposition chamber, comprising:
    a target;
    an insulative member connected to the target;
    a backing plate connected to the insulative member, the backing plate having annular groove surrounding the target; and
    a target shield mounted in the annular groove and forming a portion of the backing plate.

12. The target assembly of claim 11, wherein the target shield has a rectangular cross section.

13. The target assembly of claim 12, wherein the target shield has an outer surface roughness for improved adhesion of any particles which contact the target shield.

14. The target assembly of claim 13, wherein the target shield is mounted to the backing plate with fasteners having an outer surface that is flush with the outer surface of the target shield.

15. The target assembly of claim 14, wherein the target comprises tapered edges.

16. A target assembly for a deposition chamber, comprising:
    a circular deposition target having tapered edges;
    an insulative member connected to the target;
    a backing plate connected to the insulative member, the backing plate having an annular groove surrounding the deposition target; and
    a target shield mounted in the annular groove and substantially disposed on the backing plate.

17. The target assembly of claim 16, wherein the target shield has a rectangular cross section.

18. The target assembly of claim 16, wherein the target shield has an outer surface roughness.

19. The target assembly of claim 16, wherein the target shield is mounted to the backing plate with fasteners having an outer surface that is flush with the outer surface of the target shield.

20. The target assembly of claim 6, wherein the surface roughness is between about 0.05 mm and about 0.5 mm.

21. The target assembly of claim 10, wherein the insulative member is substantially annular and radially coextensive with the target.

22. The target assembly of claim 18, wherein the outer surface roughness is between about 0.05 mm and about 0.5 mm.

23. A target assembly for a deposition chamber, comprising:
    a consumable target mounted on a mounting surface;
    an exposable surface disposed in the chamber around the consumable target, wherein the exposable surface comprises a portion of the mounting surface; and
    an annular target shield removably disposed on the exposable surface around the consumable target wherein an inner diameter of the annular target shield abuts an outer diameter of the consumable target and comprises a shielding surface disposed substantially parallel to the exposable surface.

24. The target assembly of claim 23, wherein the exposable surface defines an annular groove and the annular target shield is disposed therein.

25. The target assembly of claim 23, wherein the annular target shield and the exposable surface comprise anodized aluminum.

26. The target assembly of claim 23, wherein the annular target shield and the exposable surface comprise a substantially planar surface.

27. A target assembly for a deposition chamber, comprising:
    a backing plate;
    a target disposed on the backing plate to define an inner perimeter of an exposable backing plate surface surrounding the target;
    a shield disposed on the deposition chamber and defining an outer perimeter of the exposable backing plate surface; and
    a removable surface disposed on the exposable surface of the backing plate between the inner perimeter and the outer perimeter.

28. The target assembly of claim 27, wherein the exposable surface comprises an annular grove and the removable surface is substantially disposed in the annular groove.

* * * * *

UNITED STATES PATENT AND TRADEMARK OFFICE
CERTIFICATE OF CORRECTION

PATENT NO. : 6,045,670
DATED : April 4, 2000
INVENTOR(S) : Adams et al.

It is certified that error appears in the above-identified patent and that said Letters Patent is hereby corrected as shown below:

In column 4, line 11, after " backing" , please delete " ," .

In column 4, line 33, before " edge" , please replace " tipper" with --upper--.

Signed and Sealed this

Twenty-seventh Day of March, 2001

Attest:

NICHOLAS P. GODICI

*Attesting Officer*     *Acting Director of the United States Patent and Trademark Office*